United States Patent
Shim et al.

[11] Patent Number: 5,905,633
[45] Date of Patent: May 18, 1999

[54] BALL GRID ARRAY SEMICONDUCTOR PACKAGE USING A METAL CARRIER RING AS A HEAT SPREADER

[75] Inventors: Kwon Shim, Seoul; Young Wook Heo, Kyungki-do, both of Rep. of Korea

[73] Assignees: ANAM Semiconductor Inc., Seoul, Rep. of Korea; AMKOR Technology, Inc., Chandler, Ariz.

[21] Appl. No.: 08/775,212

[22] Filed: Dec. 31, 1996

[30] Foreign Application Priority Data

Feb. 29, 1996 [KR] Rep. of Korea ........................ 96-05345

[51] Int. Cl.$^6$ ..................................................... H05H 7/20
[52] U.S. Cl. ........................ 361/704; 165/80.2; 174/16.3; 257/713; 361/718; 361/719
[58] Field of Search ................................. 165/80.2, 80.3, 165/105; 174/16.3; 257/706, 707, 712, 713; 361/704, 707, 709, 717–723

[56] References Cited

U.S. PATENT DOCUMENTS

| | | | |
|---|---|---|---|
| 5,397,921 | 3/1995 | Karnezos | 361/718 |
| 5,455,456 | 10/1995 | Newman | 257/706 |
| 5,552,635 | 9/1996 | Kim et al. | 257/706 |
| 5,598,321 | 1/1997 | Mostafazadeh et al. | 361/718 |

*Primary Examiner*—Gregory Thompson
*Attorney, Agent, or Firm*—Skjerven, Morrill, MacPherson, Franklin & Friel LLP

[57] ABSTRACT

A ball grid array semiconductor package includes a semiconductor chip mounted to the top side of a printed circuit board (PCB), having a copper circuit pattern at a position outside a chip mounting zone. A plurality of bond wires electrically connect the chip to the copper circuit pattern. A rectangular ring-shaped metal heat spreader is attached to the PCB surrounding the chip, with the outer periphery of the ring substantially coextensive with the outer periphery of the PCB. A molding compound is provided in a zone inside the heat spreader thus protecting the chip and wires from atmosphere, while the molding compound extends to a heat spreader portion, leaving other portions of the heat spreader exposed to atmosphere. A plurality of solder balls are included on the bottom side of the PCB and are used as signal input and output terminals of the package. The BGA package easily dissipates heat during the operation of the package, improving the operational reliability of the package. A plurality of grooves may be formed on the heat spreader, to improve the integrating force between the molding compound and the heat spreader and to protect the chip from moisture.

6 Claims, 4 Drawing Sheets

BALL GRID ARRAY SEMICONDUCTOR PACKAGE USING A METAL CARRIER RING AS A HEAT SPREADER

BACKGROUND OF THE INVENTION

1. Field of the Invention

The present invention relates, in general, to a method of producing BGA (ball grid array) semiconductor packages and to a BGA package produced through such a method and, more particularly, to an improvement in such a method for producing BGA packages, with improved quality, improved heat dissipating effect and reduced manufacturing cost, by forming a strip or reel-type metal carrier frame by attaching a plurality of unit PCBs (printed circuit boards) to individual PCB carriers of a metal carrier frame and by using a part of such a metal carrier frame as heat spreaders of individual resulting BGA packages.

2. Description of the Prior Art

FIGS. 1A and 1B show the construction of a typical BGA (ball grid array) semiconductor package. As shown in the drawings, the typical BGA package comprises a PCB (printed circuit board) 1 and a semiconductor chip 2 attached to the top of the PCB 1. The chip pads of the semiconductor chip 2 are electrically connected to the circuit pattern 11 of the PCB 1 through a plurality of wires 3. The semiconductor chip 2, which is attached to the top of the PCB 1, is packaged with a mold compound 4 thus being prevented from being brought into contact with atmosphere and being prevented from oxidation or corrosion.

In the prior art, such BGA packages are produced using a PCB strip, which includes a plurality of PCBs integrated into a single strip and having individual circuit patterns 11. However, such a method of producing the BGA packages using such a PCB strip is problematic in that the method causes waste of an expensive PCB and thereby increases the manufacturing cost of the BGA packages.

That is, the typical method of producing such BGA packages uses a PCB strip, which includes a plurality of PCBs 1 integrated into a single strip, in an effort to smoothly feed the PCBs and to effectively control the positions of PCBs. However, after producing the BGA packages, it is necessary to cut the PCB strip into individual PCBs, with PCB margins being cut out and discarded thus increasing the manufacturing cost of the packages.

In addition, the PCBs 1 used in the typical BGA packages is made of resin, so that the PCBs 1 may be deformed due to thermal expansion while they are treated in repeated high temperature steps of a package producing process. Such thermally-deformed PCBs cause problems during continued steps of the package producing process.

In the typical BGA package, a plurality of solder balls 5 formed on the PCB 1 are used as signal input and output terminals of the package. When the tips of the solder balls 5 are not leveled on the same plane thus failing to maintain the flatness, the package has some open solder balls when the package is mounted to a mother board. In this case, the BGA package cannot perform its function. When the PCBs 1 are thermally deformed or bent while they are treated in the repeated high temperature steps as described above, the solder balls 5 on each PCB 1 inevitably fails to maintain the flatness, so that such solder balls 5 reduce the quality of a resulting package and thereby reducing productivity and operational reliability of the BGA packages.

SUMMARY OF THE INVENTION

It is, therefore, an object of the present invention to provide a method of producing BGA packages in which the above problems can be overcome and which uses a strip or reel-type metal carrier frame including a plurality of unit PCBs attached to individual PCB carriers of a metal carrier frame thus preventing thermal-deformation of the PCBs during the high temperature steps of the process and which uses a part of such a metal carrier frame as heat spreaders of individual resulting BGA packages thus allowing the BGA packages to effectively dissipate heat into atmosphere and improving the operational reliability of the packages.

Another object of the present invention is to provide a BGA package produced by such a method.

In order to accomplish the above objects, the present invention provides a method of producing a BGA semiconductor package, comprising the steps of: forming a strip or reel-type metal carrier frame, the carrier frame having a plurality of regularly-spaced holes formed on a line of the frame, a plurality of slits and a plurality of regularly-spaced PCB carriers, each of the holes being larger than a semiconductor chip, the slits being formed on the edge of each of the holes thus surrounding each of the holes, and each of the PCB carriers having a rectangular ring shape and being formed between each of the holes and the slits; attaching a plurality of unit PCBs to the bottom sides of the respective PCB carriers thus sealing the holes; mounting a semiconductor chip to the top side of each of the unit PCBs; bonding a plurality of wires to a plurality of chip pads of the semiconductor chip and to a copper circuit pattern of each of the unit PCBs thus electrically connecting the chip pads to the copper circuit pattern; packaging the semiconductor chip and wires with molding compound thus protecting the chip and wires from atmosphere; welding a plurality of signal input and output solder balls onto the bottom side of each of the unit PCBs; and cutting the metal carrier frame at positions between the slits thus dividing a plurality of integrated BGA packages into individual packages.

The present invention also provides a BGA semiconductor package, comprising: a semiconductor chip mounted to the top side of a PCB (printed circuit board); the PCB having a copper circuit pattern at a position outside a chip mounting zone of the PCB; a plurality of wires bonded to the chip and to the copper circuit pattern thus electrically connecting the chip to the copper circuit pattern; a rectangular ring-shaped heat spreader attached to the top side of the PCB in order to surround the chip; a molding compound packaging a zone inside the heat spreader thus protecting the chip and wires from atmosphere; and a plurality of solder balls formed on the bottom side of the PCB and used as signal input and output terminals of the package.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1:
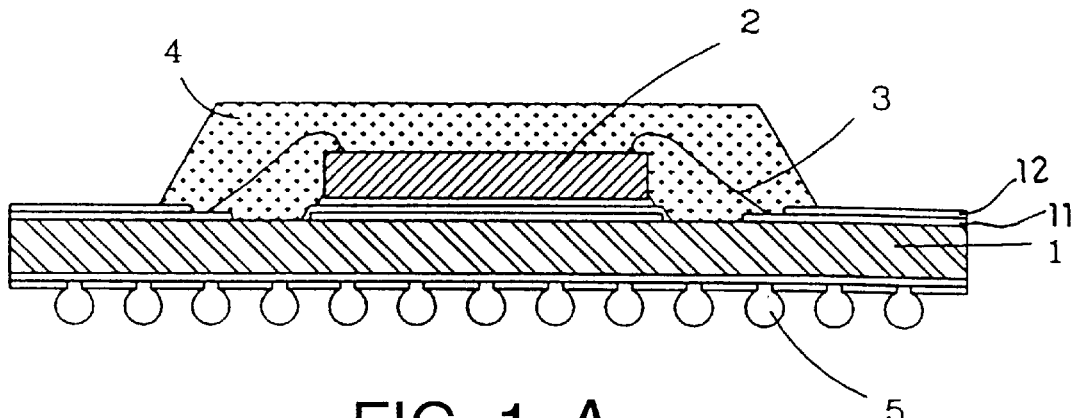
FIGS. 1A and 1B are sectional and plan views showing the construction and configuration of a typical BGA semiconductor package, respectively.
Figure 1:
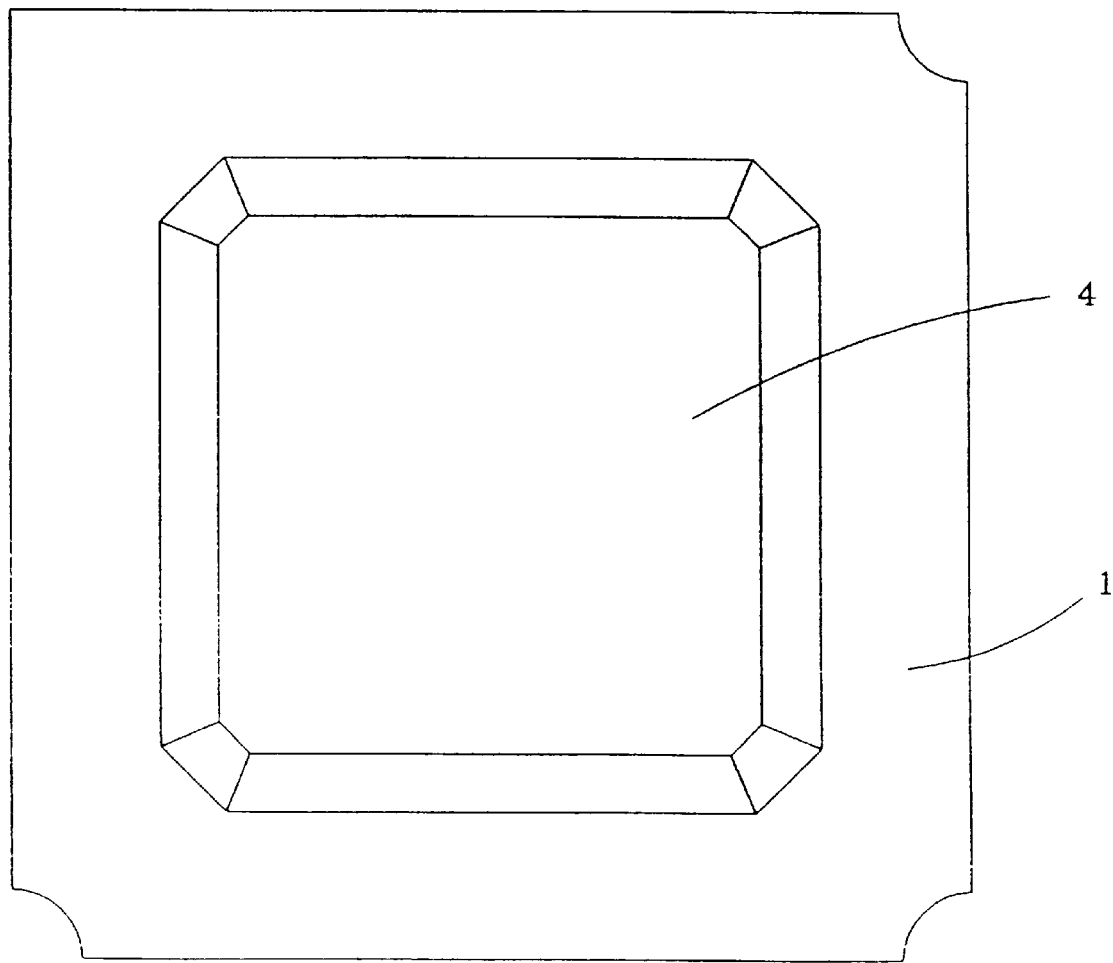
Figure 2A:
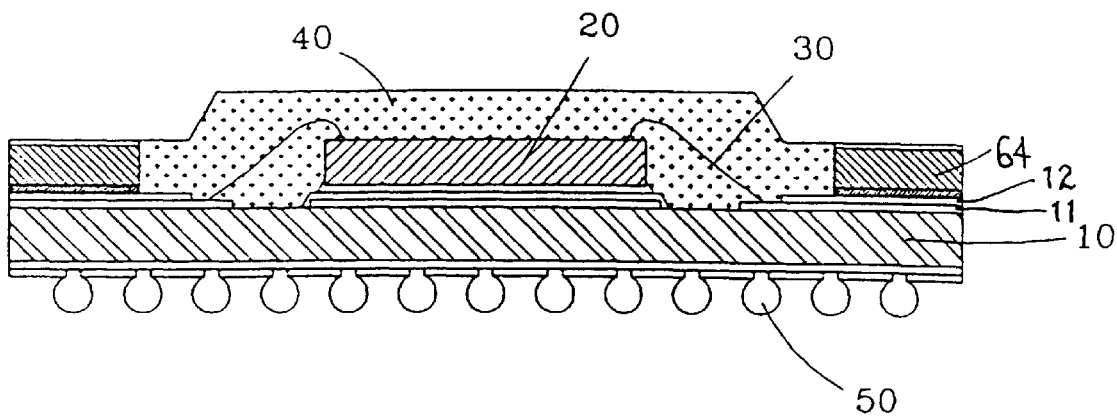
FIGS. 2A and 2B are sectional and plan views showing the construction and configuration of a BGA semiconductor package in accordance with the preferred embodiment of the present invention, respectively.
Figure 2B:
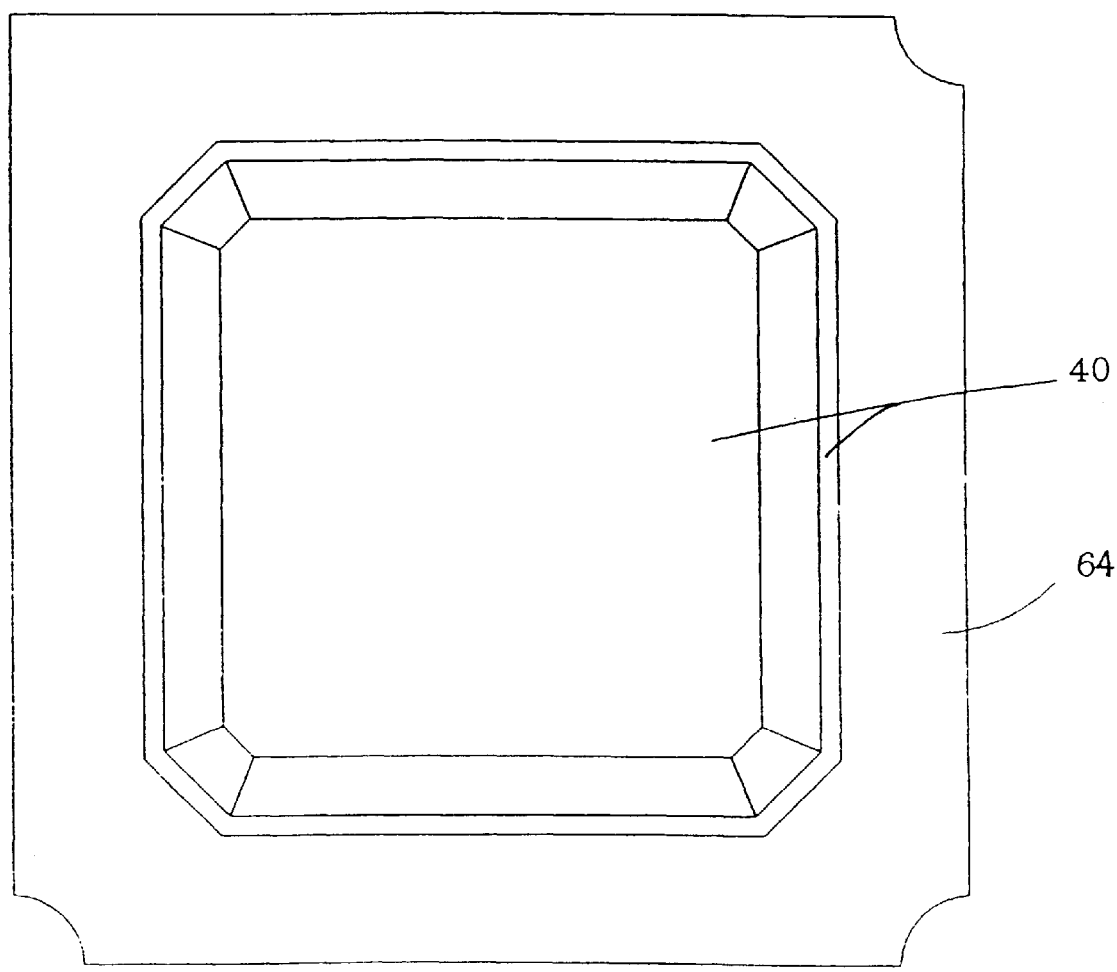

FIGS. 2A and 2B are sectional and plan views showing the construction and configuration of a BGA semiconductor package in accordance with the preferred embodiment of the present invention, respectively. As shown in the drawings, the BGA package of this invention comprises a PCB 10 and a semiconductor chip 20 attached to the top of the PCB 10. The chip pads of the semiconductor chip 20 are electrically connected to the circuit pattern 11 of the PCB 10 through a plurality of wires 30. The semiconductor chip 20, which is attached to the top of the PCB 10, is packaged with a mold compound 40, so that the chip 10 is prevented from being brought into contact with atmosphere thus being prevented from oxidation or corrosion. A plurality of solder balls 50 are formed on the bottom side of the PCB 10 and are used as signal input and output terminals of the package. A PCB carrier 64, which is a part of a metal carrier frame 60 (FIG. 3A) and has a rectangular ring shape, is provided on the package at a position above the top edge of the PCB 10 or at the position about the molding zone of the molding compound 40.

Figure 3A:
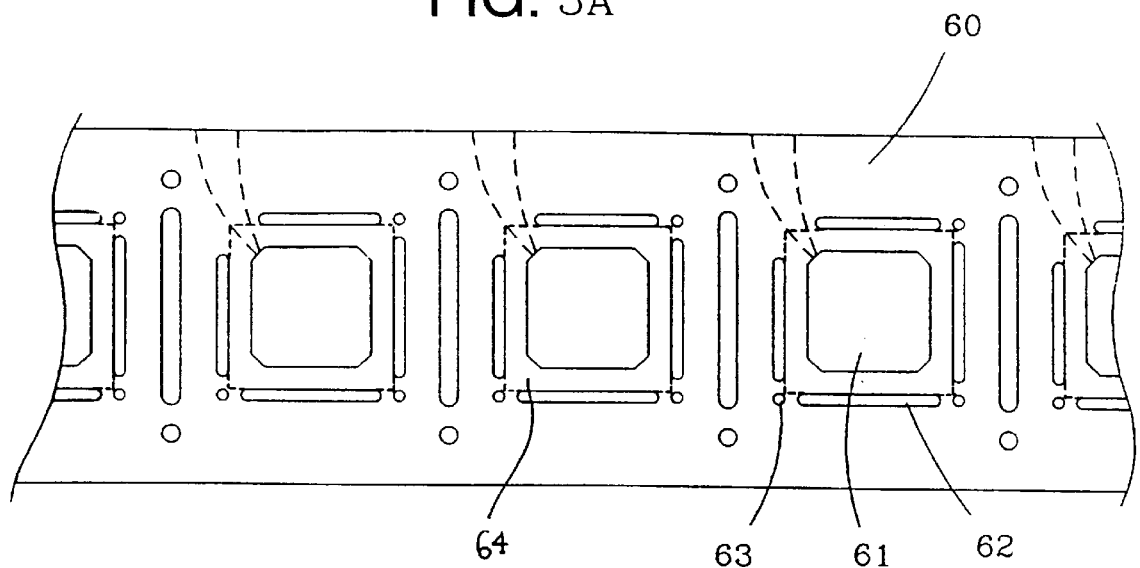
FIGS. 3A and 3B are plan views showing the construction of different metal carrier frames used in the present invention.
Figure 3B:
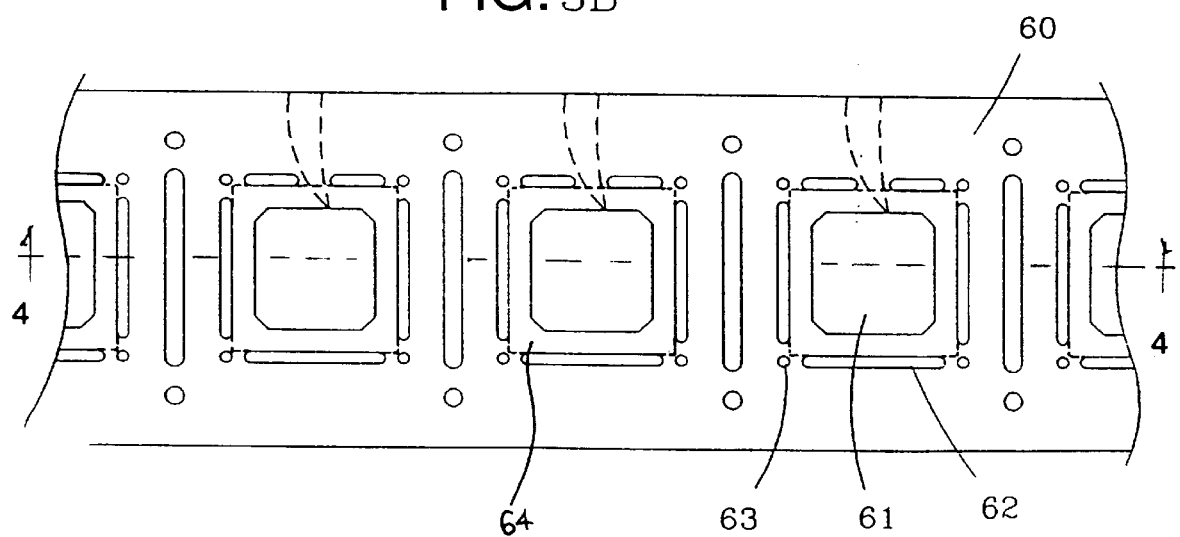
Figure 4:
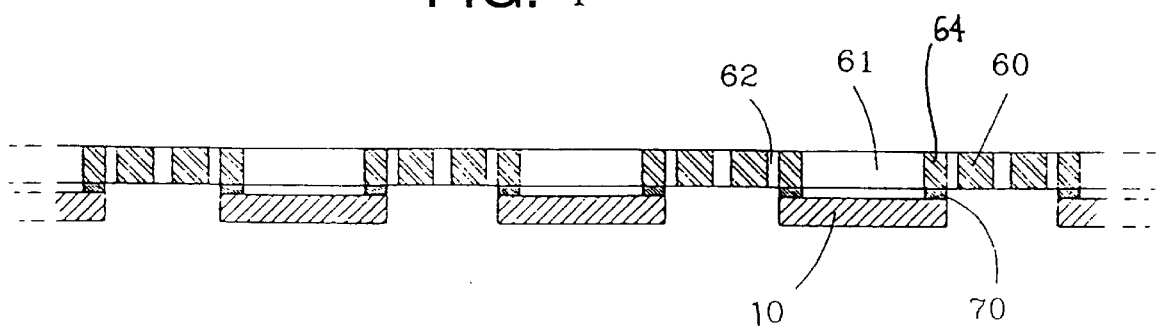
FIG. 4 is a sectional view taken on the line 4—4 of FIG. showing the unit PCBs attached to respective PCB carriers of a metal carrier frame of the present invention.

FIGS. 3A and 3B are plan views showing the construction of different metal carrier frames 60 used in the present invention. FIG. 4 is a sectional view showing the unit PCBs 10 each of which is attached to the bottom side of an associated PCB carrier 64 of the metal carrier frame 60 using a bonding agent 70. The above metal carrier frame 60 may be plated with a layer of silver (Ag). Alternatively, the frame 60 may be plated with a layer of palladium (Pd) by a spot plating process. As a further alternative, the frame 60 may be plated with a layer of nickel (Ni) on its top side.

In the present invention, it is preferable to form the metal carrier frame 60 from a high thermal conductive material such as copper, copper alloys or stainless steel. In addition, it is preferable to select the bonding agent 70, which attaches the PCBs 10 to the frame 60, from a group of high thermal conductive bonding agents such as silver containing epoxy resin.

FIGS. 3A and 3B are plan views showing the construction of the strip or reel-type metal carrier frames 60 used in the present invention. As shown in the drawings, a plurality of holes 61 are formed on each frame 60 with regular intervals. That is, the above holes 61 are formed on the frame 60 at regular-spaced positions on which the unit PCBs 10 are to be attached to the frame 60. Each hole 61 is smaller than each unit PCB 10 but is larger than each semiconductor chip. A plurality of slits 62 are formed on the edge of each hole 61 in a way such that the inside edges of the slits 62 are aligned with the outside edge of each PCB 10 when the PCBs 10 are attached to the frame 60. That is, each PCB carrier 64 of the frame 60 is formed on the frame 60 at a position between each hole 61 and associated slits 62. Each unit PCB 10 is attached to the PCB carrier 64 by a bonding agent 70. The PCB carrier 64 may have a plurality of grooves (FIG. 6) at a position in vicinity to the hole 61, thus improving the integrating force between the molding compound and the PCB carrier 64 and protecting the chip from moisture.

In addition, a plurality of circular holes 63 are formed on the frame 60 at corners between the slits 62. Due to the above holes 63, the frame 60 is easily cut into several pieces after forming the BGA packages. Both the slits 62 and the circular holes 63 release stress caused by thermal expansion and thermal shrinkage during the package producing process and minimize the cutting area of the frame 60 when the frame 60 is cut into several pieces through a punching process. The above circular holes 63 are formed on the corners between the slits 62. In an embodiment, one corner between the slits 62 may be not provided with the hole 63 as shown in FIG. 3A. In this case, the corner free from the hole 63 may be used as a mold runner gate (shown in dash lines) which introduces the molding compound 40 during a molding process. As shown in FIG. 3B, all the corners between the slits 62 may be provided with circular holes 63 and one slit 62 may be divided into two slits with a rib remaining between the divided slits. In this case, the rib between the divided slits 62 is used as a mold runner gate which introduces the molding compound 40 during a molding process. That is, the metal carrier frame 60 of this invention has a plurality of mold runner gates which are formed on the top side of the frame 60 regardless of embodiments.

FIG. 4 is a sectional view showing the unit PCBs 10 which are attached to the PCB carriers 64 of the metal carrier frame 60 using the bonding agent 70. As shown in FIG. 4, a strip or reel-type metal carrier frame is formed by attaching the unit PCBs 10 to the PCB carriers 64 of the metal carrier frame 60 and in turn is subjected to post-processes. Therefore, it is possible to produce integrated BGA semiconductor packages through a conventional package producing process. After producing the integrated BGA packages, the integrated packages are divided into individual packages by cutting the frame 60 at positions between the slits 62 and by dividing the PCB carriers 64 from each other.

Figure 5:
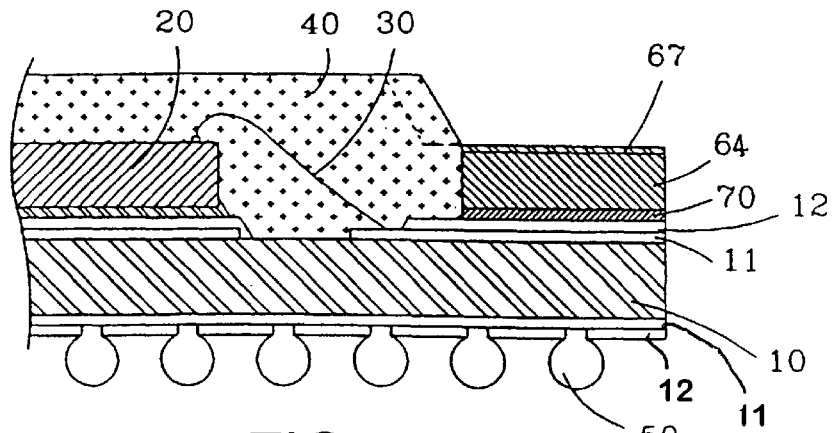
FIG. 5 is a sectional partial view showing the construction of a BGA semiconductor package in accordance with the primary embodiment of the present invention.
Figure 6:
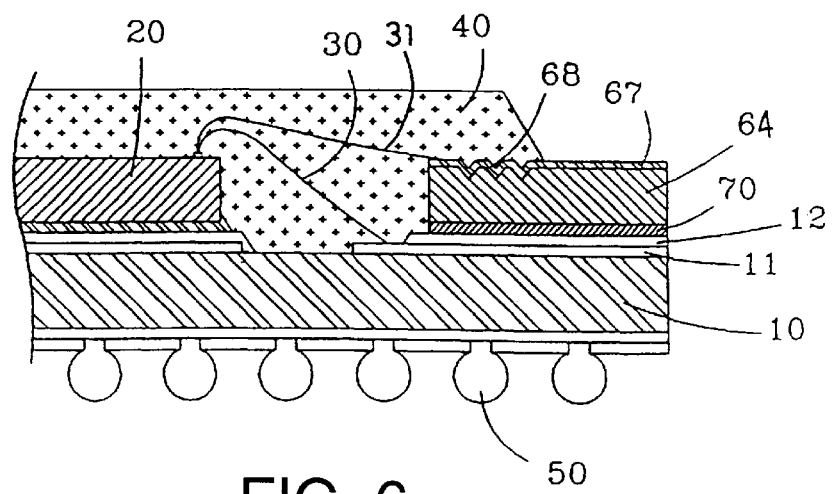
FIG. 6 is a sectional partial view showing the construction of a BGA semiconductor package in accordance with the second embodiment of the present invention.
Figure 7:
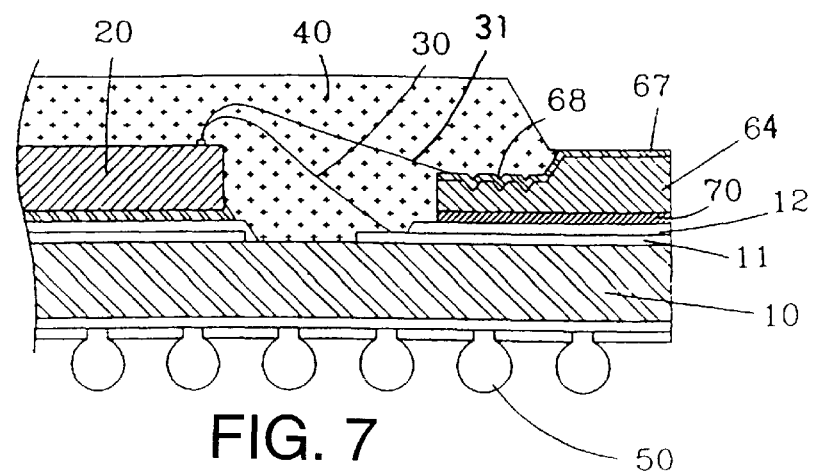
FIG. 7 is a sectional partial view showing the construction of a BGA semiconductor package in accordance with the third embodiment of the present invention.

FIGS. 5 to 7 show the construction of BGA semiconductor packages in accordance with the primary to third embodiments of the present invention, respectively.

As shown in FIG. 5, the BGA package according to the primary embodiment comprises a semiconductor chip 20. The semiconductor chip 20 is mounted to a PCB 10. The PCB 10 is provided with top and bottom copper circuit patterns 11 on its top and bottom sides. Top and bottom solder resist layers 12 are selectively formed on the top and bottom copper circuit patterns 11. A plurality of wires 30 are bonded to the chip pads of the semiconductor chip 20 and to the top copper circuit pattern 11 thus electrically connecting the chip pads to the pattern 11. A predetermined zone including the semiconductor chip 20 is packaged by a molding compound 40 thus being protected from atmosphere. A PCB carrier 64, which is a part of the metal carrier frame, is attached to the top side of the PCB 10 using the bonding agent 70 and is used as a heat spreader of the package. A silver (Ag), nickel (Ni) or palladium (Pd) layer 67 is plated on at least one side, for example, the top side of the metal carrier frame 60. The plated layer 67 prevents oxidation and corrosion of the frame 60 and improves integrating force between the frame 60 and the molding compound 40. A plurality of solder balls 50 are formed on the bottom side of the PCB 10 and are used as signal input and output terminals. In the above package, the molding compound 40 may be preferably molded to the zone as shown by the dotted line of FIG. 5. In this case, the molding compound 40 may be easily arrayed.

In the second embodiment shown in FIG. 6, the general shape of the package remains the same as described for the primary embodiment, but the PCB carrier 64 of the metal carrier frame 60 is partially packaged by the molding compound 40. In this embodiment, a plurality of wires 31 are ground-bonded to a part of the metal carrier frame 60, which is to be packaged by the molding compound 40, prior to molding the package. In addition, a plurality of grooves 68 are formed on the part of the metal carrier frame 60, which is to be packaged by the molding compound 40, thus improving the integrating force between the molding compound 40 and the frame 60 and protecting the chip 20 from moisture. In this case, the grooves 68 preferably have a V-shaped configuration.

In the third embodiment shown in FIG. 7, the general shape of the package remains the same as described for the second embodiment, but a grooved zone of the PCB carrier 64, which is to be packaged by the molding compound 40, is stepped down. In this embodiment, a plurality of wires 31 are ground-bonded to a part of the metal carrier frame 60, which is to be packaged by the molding compound 40, prior to molding the package. In addition, a plurality of grooves 68 are formed on the stepped portion of the metal carrier frame 60, thus improving the integrating force between the molding compound 40 and the frame 60 and protecting the chip 20 from moisture.

As described above, the present invention provides a method of producing BGA packages using a metal carrier frame and a BGA package produced by such a method. In the method of this invention, a plurality of unit PCBs are attached to the metal carrier frame, with a part of the frame being exposed to the outside of the PCBs and being used as heat spreaders of individual resulting packages. Therefore, the BGA package of this invention easily dissipates heat generated from the semiconductor chip during the operation of the package, thus improving the operational reliability of the BGA package. In addition, the BGA package producing method of the present invention uses a strip or reel-type metal carrier frame with the unit PCBs being attached to the PCB carriers of the metal frame. The method using such a strip or reel-type metal carrier frame effectively minimizes the bending of the PCBs regardless of repeated high temperature steps, simplifies the package producing process and improves productivity of the packages in comparison with a conventional BGA package producing method using a PCB strip. In accordance with the present invention, the PCB carriers, which is a part of the metal carrier frame, can be used as mold runner gates during a molding step, so that it is not necessary to use a plated part of the PCB as mold runner gates. Furthermore, a plurality of grooves are formed on a part of each PCB carrier, which is to be packaged by the molding compound, thus improving the integrating force between the molding compound and the PCB carrier and protecting the chip from moisture.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A ball grid array semiconductor package, comprising;
   a semiconductor chip mounted to the top side of a PCB (printed circuit board);
   the PCB having a copper circuit pattern at a position outside a chip mounting zone thereof;
   a plurality of wires bonded to the chip and to the copper circuit pattern thus electrically connected the chip to the copper circuit pattern;
   a rectangular ring-shaped metal heat spreader attached to the top of said PCB in order to surround said chip, said heat spreader having an outer peripheral surface substantially co-extensive with an outer peripheral surface of said PCB;
   a molding compound packaging a zone inside said heat spreader thus protecting the chip and wires from atmosphere, said molding compound extending only to a portion of said spreader and wherein other portions of said spreader extending exposed to atmosphere peripherally from the molding compound;
   a plurality of solder balls formed on the bottom side of said PCB and used as signal input and output terminals of the package; and
   wherein the top side of said heat spreader is partially packaged by the molding compound and a second plurality of wires is in a ground-bonded connection to said chip and to the packaged top side of said heat spreader.

2. A ball grid array semiconductor semiconductor package, comprising:
   a semiconductor chip mounted to the top side of a PCB (printed circuit board);
   the PCB having a copper circuit pattern at a position outside a chip mouting zone thereof;
   a plurality of wires bonded to the chip and to the copper circuit pattern thus electrically connecting the chin to the copper circuit pattern;
   a rectangular ring-shaped heat spreader attached to the top side of said PCB in order to surround said chip;
   a molding compound packaging a zone inside said heat spreader thus protecting the chip and wires from atmosphere;
   a plurality of solder balls formed on the bottom side of said PCB and used as signal in out and output terminals of the package; and
   wherein the top side of said heat spreader is plated with a layer of silver, palladium or nickel, said layer being a plated layer on said heat spreader.

3. The BGA semiconductor package according to claim 2, wherein the molding compound is partially leveled with the top side of said heat spreader at a position in vicinity to the heat spreader.

4. A ball grid array semiconductor package comprising:
   a semiconductor chip mounted to the top side of a PCB (printed circuit board);
   the PCB having a copper circuit pattern at a position outside a chip mounting zone thereof;
   a plurality of wires bonded to the chip and to the copper circuit pattern thus electrically connecting the chip to the copper circuit pattern;
   a rectangular ring-shaped heat spreader attached to the top side of said PCB in order to surround said chip;
   a molding compound packaging a zone inside said heat spreader thus protecting the chip and wires from atmosphere;
   a plurality of solder balls formed on the bottom side of said PCB and used as a signal input and output terminals of the package;
   wherein the top side of said heat spreader is partially packaged by the molding compound and a second plurality of wires is in a ground-bonded connection to said chip and to the packaged top side of said heat spreader; and wherein the packaged top side of said heat spreader is provided with a plurality of V-shaped grooves.

5. Semiconductor package according to claim 4;

wherein the packaged top side of said heat spreader is stepped down.

6. A ball grid array semiconductor package, comprising;

a semiconductor chip mounted to the top side of a PCB (printed circuit board);

the PCB having a copper circuit pattern at a position outside a chip mounting zone thereof;

a plurality of wires bonded to the chip and to the copper circuit pattern thus electrically connecting the chip to the copper circuit pattern;

a rectangular ring-shaped heat spreader attached to the top side of said PCB in order to surround said chip;

a molding compound packaging a zone inside said heat spreader thus protecting the chip and wires from atmosphere;

a plurality of solder balls formed on the bottom side of said PCB and used as a signal input and output terminals of the package;

wherein the top side of said heat spreader is partially packaged by the molding compound and a second plurality of wires is in a ground-bonded connection to chip and to the packaged top side of said heat spreader; and wherein the packaged top side of said heat spreader is stepped down.

* * * * *

UNITED STATES PATENT AND TRADEMARK OFFICE
CERTIFICATE OF CORRECTION

| | | |
|---|---|---|
| PATENT NO. | : | 5,905,633 |
| ISSUE DATE | : | May 18, 1999 |
| INVENTOR(S) | : | Il Kwon Shim; Seoul, Rep. of Korea |
| | | Young Wook Heo; Kyungki-do, Rep. of Korea |
| ASSIGNEE(S) | : | ANAM Semiconductor, Inc., Seoul, Rep. of Korea; |
| | | AMKOR Technology, Inc., Chandler, Ariz. |

It is certified that error appears in the above-identified patent and that said Letters Patent is hereby corrected as shown below:

On the front page of the patent, in the list of inventors, the correct name of the first-listed inventor is:

Il Kwon Shim

Signed and Sealed this

Twenty-eighth Day of September, 1999

*Attest:*

Q. TODD DICKINSON

*Attesting Officer*  *Acting Commissioner of Patents and Trademarks*